(12) United States Patent
Shim et al.

(10) Patent No.: US 7,189,638 B2
(45) Date of Patent: Mar. 13, 2007

(54) METHOD FOR MANUFACTURING METAL STRUCTURE USING TRENCH

(75) Inventors: Dong-sik Shim, Seoul (KR); Kyung-won Na, Yong-si (KR); Sang-on Choi, Suwon-si (KR); Hae-seok Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/739,578

(22) Filed: Dec. 19, 2003

(65) Prior Publication Data

US 2004/0219778 A1    Nov. 4, 2004

(30) Foreign Application Priority Data

Dec. 20, 2002   (KR)   ................. 10-2002-0081580

(51) Int. Cl.
*H01L 21/4763* (2006.01)
(52) U.S. Cl. ............... 438/625; 438/626; 438/631; 438/642; 438/645; 257/E21.586
(58) Field of Classification Search ........ 438/625–626, 438/631, 641, 642, 645, 687, 697; 257/762, 257/763; 216/40
See application file for complete search history.

(56) References Cited

U.S. PATENT DOCUMENTS

| 5,098,860 | A | * | 3/1992 | Chakravorty et al. ....... 438/628 |
| 5,420,068 | A | | 5/1995 | Mizushima |
| 5,436,504 | A | | 7/1995 | Chakravorty et al. |
| 5,723,387 | A | * | 3/1998 | Chen ......................... 438/692 |
| 6,080,656 | A | * | 6/2000 | Shih et al. .................. 438/626 |
| 6,110,817 | A | * | 8/2000 | Tsai et al. ................... 438/618 |
| 6,162,728 | A | | 12/2000 | Tsao et al. |
| 6,197,181 | B1 | * | 3/2001 | Chen ......................... 205/123 |
| 6,224,737 | B1 | * | 5/2001 | Tsai et al. ................... 205/123 |
| 6,350,364 | B1 | * | 2/2002 | Jang ........................... 205/118 |
| 6,492,268 | B1 | * | 12/2002 | Pyo ............................ 438/687 |
| 6,699,396 | B1 | * | 3/2004 | Drewery ..................... 216/40 |

FOREIGN PATENT DOCUMENTS

| JP | 05-090262 | 4/1993 |
| JP | 2000-188293 | 7/2000 |

* cited by examiner

*Primary Examiner*—Alexander Ghyka
(74) *Attorney, Agent, or Firm*—Lee & Morse, P.C.

(57) ABSTRACT

A method for manufacturing a metal structure using a trench includes etching a semiconductor substrate to form a trench, depositing a seed layer over the semiconductor substrate including in the trench, stacking an insulating layer over the seed layer, removing a portion of the insulating layer to expose a portion of the seed layer at a bottom of the trench, filling the trench with a metal material, and removing the seed layer and the insulating layer on the semiconductor substrate. As a result, a subsequent process in forming a multi-layered structure may be easily carried out, thereby simplifying a manufacturing process.

8 Claims, 3 Drawing Sheets

METHOD FOR MANUFACTURING METAL STRUCTURE USING TRENCH

BACKGROUND OF THE INVENTION

1. Field of the Invention

The present invention relates to a method for manufacturing a semiconductor. More particularly, the present invention relates to a method for manufacturing a metal structure by filling a trench formed in a substrate with a metal material.

2. Description of the Prior Art

As semiconductor fabrication technology advances, it is possible to manufacture semiconductor devices having higher aspect ratios, i.e., higher ratios of width to depth of trenches. Also, in a conventional method, a trench having a higher aspect ratio is filled with a metal material to be used for interlayer electrical connections in multi-layered structures, or to form a third structure with other structures.

FIGS. 1A to 1C illustrate schematic cross-sectional views showing an example of a prior art method for manufacturing a metal structure by means of a trench. In the method for manufacturing the metal structure using the trench, first, as shown in FIG. 1A, a semiconductor substrate 10 is etched to a desired shape and depth by means of a patterning process, thereby forming a trench 15. Then, a seed layer 12 is deposited over the semiconductor substrate 10 having the trench 15. Then, a plating process is performed on the semiconductor substrate 10 deposited with the seed layer 12, as shown in FIG. 1B. Subsequently, the seed layer 12 and a metal material 14 on the semiconductor substrate 10 are physically or chemically etched, as shown in FIG. 1C. As such, since the metal structure is present in the semiconductor substrate 10, it is possible to easily manufacture a multi-layered structure.

However, a problem may arise in a case that the structure is formed by filling the trench 15 with the metal material 14. Because the entire surface of the semiconductor substrate 10 that is deposited with the seed layer 12 is subjected to plating during a plating process, the inlet of the trench may become clogged before the trench 15, which has a higher aspect ratio, can be completely filled with the metal material 14. In this case, an undesirable void 16 is generated, causing reliability of the fabricated device to be degraded.

FIGS. 2A to 2C illustrate schematic views showing an example of another prior art method for manufacturing a metal structure by means of a trench. In this method for manufacturing the metal structure, first, a seed layer 22 is deposited over a semiconductor substrate 20, as shown in FIG. 2A, and a mold 23 is formed over the deposited seed layer 22 to form a trench 25. Then, the trench 25 formed by the mold 23 is filled with a metal material 24, as shown in FIG. 2B. Thereafter, the mold 23 and the seed layer 22 underlying the mold 23 are removed, as shown in FIG. 2C.

As such, the method for manufacturing the metal structure on the semiconductor substrate 20 by means of the mold 23 is very easy. However, in a case where the metal structure is formed on the semiconductor substrate 20 by means of the mold 23, there is a problem that subsequent processes become very difficult when manufacturing a multi-layered structure. Particularly, in a case in which a planar structure is formed on a plated structure, a plurality of processes must be added, thereby increasing complexity and cost of the manufacturing process.

SUMMARY OF THE INVENTION

In an effort to overcome the aforementioned problems, the present invention provides a method for manufacturing a metal structure using a trench in which, when forming a multi-layered structure, subsequent processes may be easily carried out, thereby simplifying the manufacturing process.

To provide these and other features and advantages, it is a feature of an embodiment of the present invention to provide a method for manufacturing a metal structure using a trench, the method including etching a semiconductor substrate to form a trench, depositing a seed layer over the semiconductor substrate including in the trench, stacking an insulating layer over the seed layer, removing a portion of the insulating layer to expose a portion of the seed layer at a bottom of the trench, filling the trench with a metal material and removing the seed layer and the insulating layer on the semiconductor substrate. Preferably, removing the portion of the insulating layer comprises removing a portion of the insulating layer formed on the bottom of the trench.

According to a method of manufacturing a metal structure using a trench of the present invention, it is possible to prevent an inlet of the trench from becoming clogged with a metal layer in a plating process, and since the metal structure is formed in a trench in the semiconductor substrate, subsequent processes for manufacturing a multi-layered structure are simplified.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean patent application no. 2002-81580, filed on Dec. 20, 2003, and entitled, "Method For Manufacturing Metal Structure Using Trench," is incorporated by reference herein in its entirety.

Figure 1A:
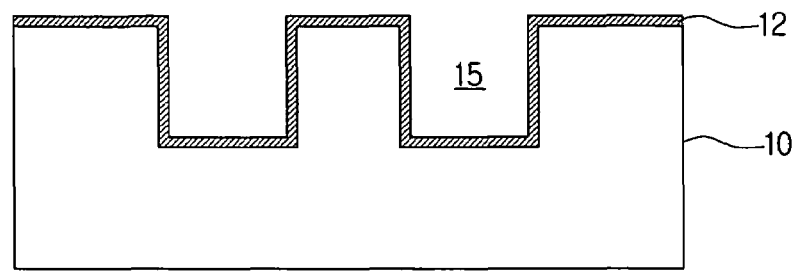
FIGS. 1A to 1C illustrate cross-sectional views sequentially showing an example of a prior art process of manufacturing a metal structure by means of a trench.
Figure 1B:
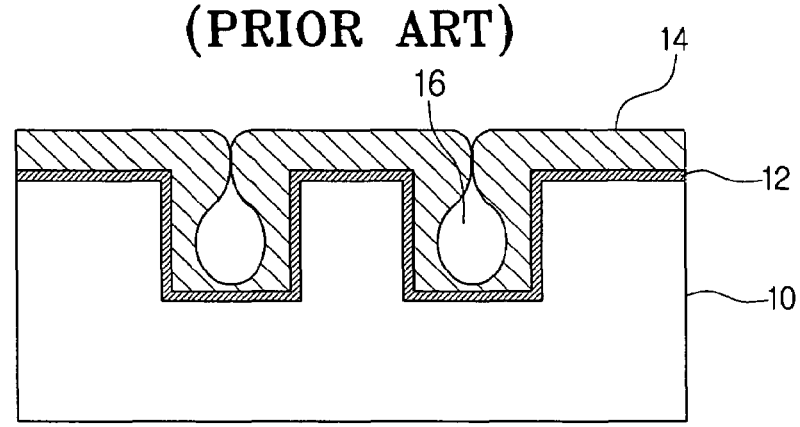
Figure 1C:
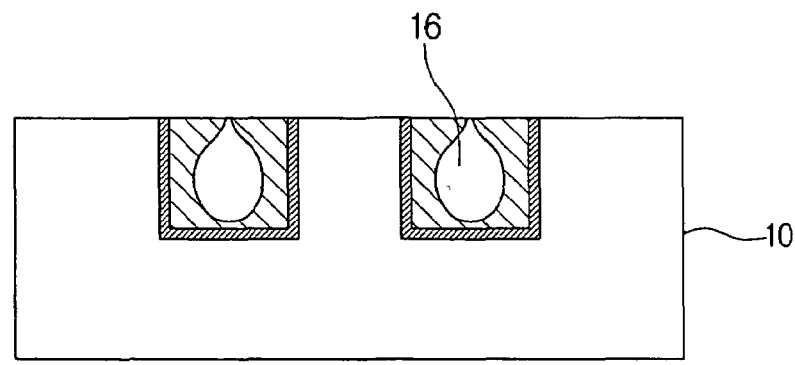
Figure 2A:
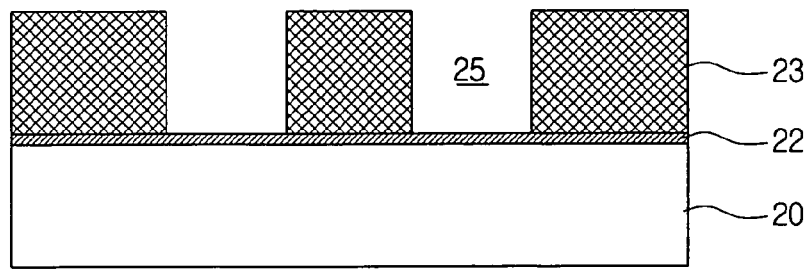
FIGS. 2A to 2C illustrate cross-sectional views sequentially showing an example of another prior art process of manufacturing a metal structure by means of a trench.
Figure 2B:
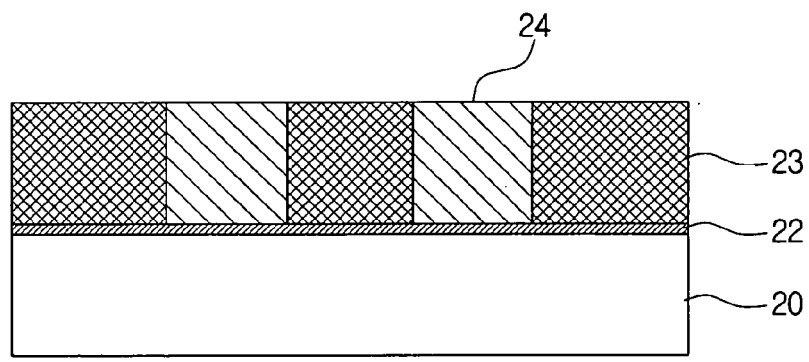
Figure 2C:
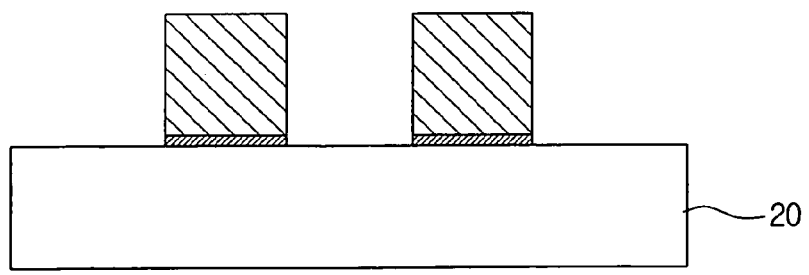
Figure 3A:
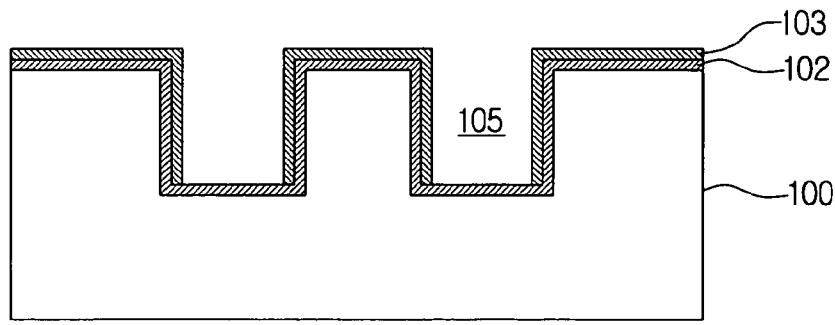
FIGS. 3A to 3C illustrate sequential process steps of manufacturing a metal structure by means of a trench according to an embodiment of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout FIGS. 3A to 3C show processes of manufacturing a metal structure using a trench according to an embodiment of the present invention.

In the method for manufacturing a metal structure using a trench according to an embodiment of the present invention first, a semiconductor substrate 100 is etched to a desired depth and width by means of a patterning process to form a trench 105. Then, a seed layer 102 is deposited over the semiconductor substrate 100 including in the trench 105. Subsequently, an insulating layer 103 is stacked over the seed layer 102. Thereafter, a portion of the insulating layer 103 on a bottom of the trench 105 is removed so that the seed layer 102 is exposed at the bottom of the trench 105. FIG. 3A illustrates a cross-sectional view of the semiconductor substrate 100 having the trench 105 in which the seed layer 102 is exposed at the bottom thereof.

Figure 3B:
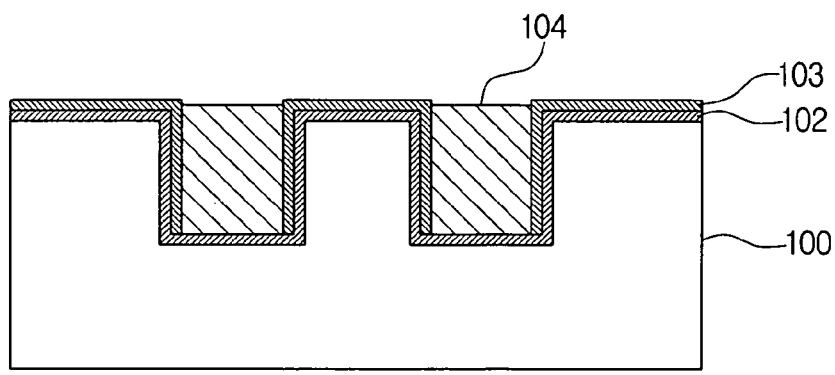
Figure 3C:
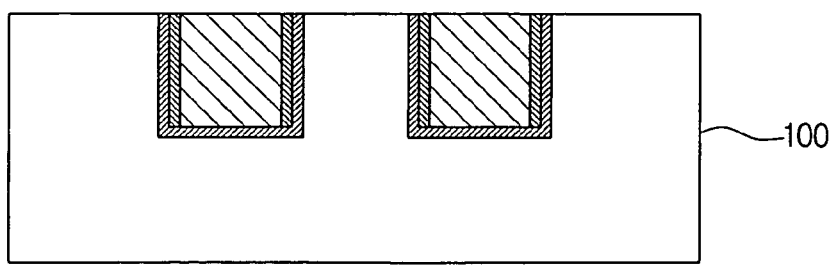

The trench 105 having the exposed seed layer 102 is filled with a metal material 104 by a plating process, as shown in FIG. 3B. When the trench 105 is filled with the metal material 104, the insulating layer 103 functions as a protective film that prevents the inlet of the trench 105 from becoming clogged before the trench 105 is completely filled with the metal material 104. Thereby, the metal material 104 is upwardly grown from the bottom of the trench 105, to cause the grown metal material 104 to follow the shape of the trench 105. FIG. 3B illustrates a cross-sectional view of the semiconductor substrate 100 having the trench 105 filled with the metal material 104 by means of the plating process.

Subsequently, the insulating layer 103 and the seed layer 102 on the semiconductor substrate 100 subjected to the plating process are etched. Thus, it is possible to obtain the semiconductor substrate having a metal structure formed therein. FIG. 3C illustrates a view of the semiconductor substrate after etching the insulating layer 103 and the seed layer 102.

As described above, a method of forming a metal structure using a trench according to an embodiment of the present invention includes forming a trench in a semiconductor substrate, forming a seed layer at the bottom of the trench, protecting an opening of the trench with an insulating layer, and performing a plating process to grow the metal material from the bottom of the trench on the seed layer to form the metal structure.

Thus, it is possible by the present invention to obtain a semiconductor substrate having a metal structure formed therein by an easy manufacturing process, while preventing an inlet of a trench from becoming clogged in a plating process. In addition, a step of removing a mold is eliminated in the present invention.

Further, in accordance with a method of forming a metal structure using a trench in an embodiment of the present invention, since the metal structure is formed in a semiconductor substrate, a subsequent process for manufacturing a multi-layered structure is simplified.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for manufacturing a metal structure using a trench, the method comprising:
   etching a semiconductor substrate to form a trench;
   depositing a seed layer over the semiconductor substrate including in the trench;
   stacking an insulating layer over the seed layer;
   removing a portion of the insulating layer only at a bottom of the trench to expose a portion of the seed layer at the bottom of the trench;
   filling the trench with a metal material; and
   removing the seed layer and the insulating layer on the semiconductor substrate, wherein at least a portion of the deposited seed layer extending substantially parallel to a plane along which the semiconductor substrate extends directly contacts the semiconductor substrate.

2. The method as claimed in claim 1, where etching the semiconductor substrate comprises using a patterning process.

3. The method as claimed in claim 1, where filling the trench with a metal material comprises plating the metal material on the exposed portion of the seed layer at the bottom of the trench.

4. The method as claimed in claim 3, where the metal material fills the trench from the bottom, growing upward.

5. The method as claimed in claim 3, where the metal material conforms to the shape of the trench.

6. The method as claimed in claim 3, where the metal material fills in the trench without any voids.

7. A method for manufacturing a metal structure using a trench, the method comprising:
   etching a semiconductor substrate to form a trench;
   depositing a seed layer over the semiconductor substrate including in the trench, the seed layer directly contacting the semiconductor substrate;
   stacking an insulating layer over the seed layer;
   removing a portion of the insulating layer only at a bottom of the trench to expose a portion of the seed layer at the bottom of the trench;
   filling the trench with a metal material; and
   removing the seed layer and the insulating layer on the semiconductor substrate.

8. A method for manufacturing a metal structure using a trench, the method comprising:
   etching a semiconductor substrate to form a trench;
   depositing a seed layer over the semiconductor substrate including in the trench;
   stacking an insulating layer over the seed layer;
   removing a portion of the insulating layer only at a bottom of the trench to expose a portion of the seed layer at the bottom of the trench;
   filling the trench with a metal material; and
   removing the seed layer and the insulating layer on the semiconductor substrate after filling the trench with the metal material, wherein when the trench is filled with the metal material, a portion of the seed layer extending substantially parallel to an upper surface of the semiconductor substrate is covered by a portion of the insulating layer remaining after the insulating layer at the bottom of the trench is removed.

* * * * *